United States Patent [19]
Goronkin

[11] Patent Number: 5,012,302
[45] Date of Patent: Apr. 30, 1991

[54] ENHANCED CONDUCTIVITY QUANTUM WELL HAVING RESONANT CHARGE COUPLING

[75] Inventor: Herb Goronkin, Scottsdale, Ariz.

[73] Assignee: Motorola, Inc., Schaumburg, Ill.

[21] Appl. No.: 501,590

[22] Filed: Mar. 30, 1990

[51] Int. Cl.$^5$ .................. H01L 27/12; H01L 45/00; H01L 29/00; H01L 33/00

[52] U.S. Cl. .......................... 357/4; 357/16; 357/17

[58] Field of Search ..................... 357/4, 16, 17

[56] References Cited

U.S. PATENT DOCUMENTS

| | | | |
|---|---|---|---|
| 4,261,771 | 4/1981 | Dingle et al. | 357/4 |
| 4,348,686 | 9/1982 | Esaki et al. | 357/4 |
| 4,665,412 | 5/1987 | Ohkawa et al. | 357/4 |
| 4,772,924 | 9/1988 | Bean et al. | 357/16 |
| 4,792,831 | 12/1988 | Baba et al. | 357/4 |
| 4,857,971 | 8/1989 | Burnham | 357/4 |

OTHER PUBLICATIONS

"Physics of Semiconductor Devices", S. M. Sze, 2nd Edition, 1981, Wiley Pub., pp. 724–730.
"Stimulated Emission in Ultrathin (20 Å), $Al_xGa_{1-x}$ As-GaAs Single Quantum Well", Lo et al., Appl. Phys. Lett., vol. 52, #22, 30 May 88, pp. 1853–1855.

Primary Examiner—Rolf Hille
Assistant Examiner—Mahshid Saadat
Attorney, Agent, or Firm—Joe E. Barbee; Stuart T. Langley

[57] ABSTRACT

An enhanced conductivity superlattice structure is provided in which a phonon generator embedded in a quantum well promotes formation of paired electrons. The superlattice structure provides electrons confined in a narrow energy gap material which is sandwiched between two barrier layers made of larger bandgap material. The electrons are provided to the quantum well by doping material in the barrier layers to provide modulation doping of the qnantum well. The quantum well contains at least one monolayer of another material within its boundaries which is a source of phonons which are generated for the purpose of electron-phonon coupling in order to cause electron pairing. In a preferred embodiment a plurality of phonon generator monolayers will be provided in the center of a quantum well, wherein the phonon generator monolayers are separated from each other by a few monolayers of quantum well material to provide increased number of phonons and therefore increased number of electron-phonon interactions.

10 Claims, 1 Drawing Sheet

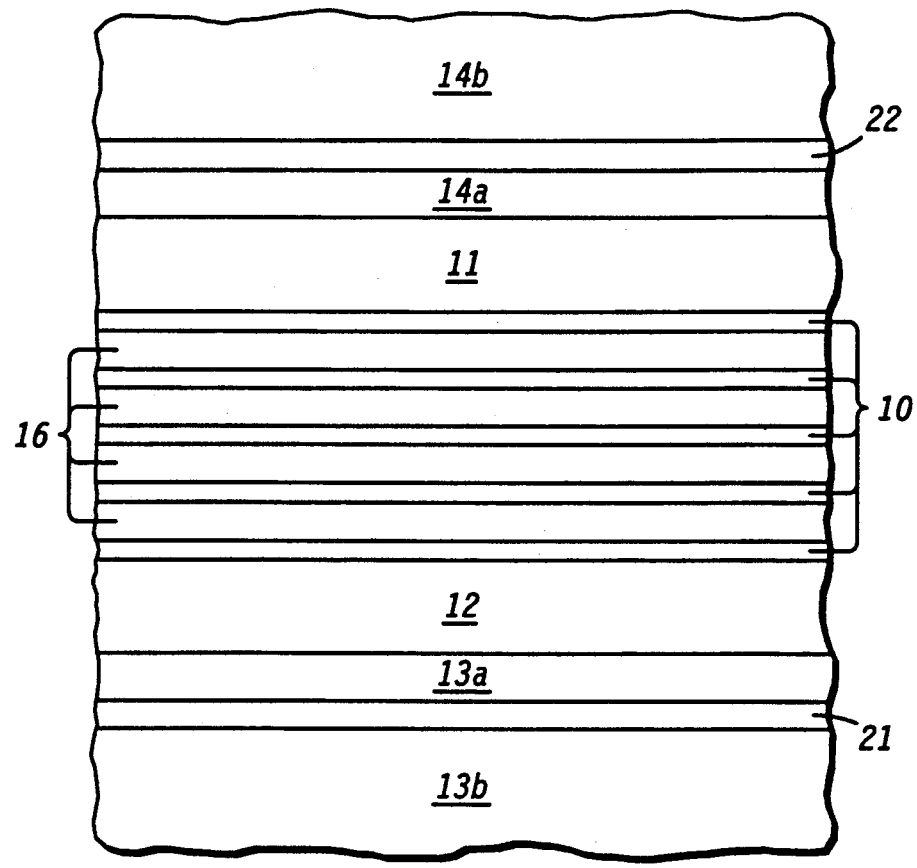
FIG. 1
FIG. 2
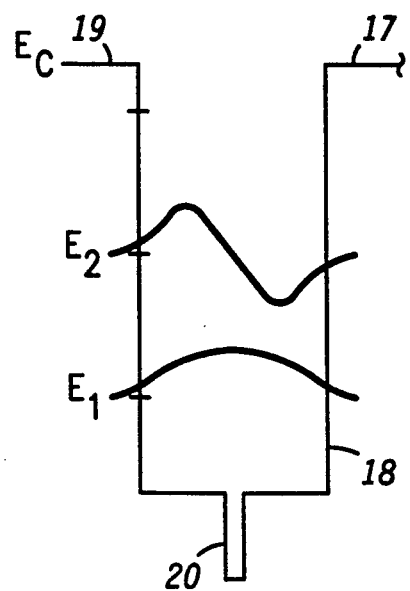

ENHANCED CONDUCTIVITY QUANTUM WELL HAVING RESONANT CHARGE COUPLING

BACKGROUND OF THE INVENTION

This invention relates, in general, to solid state conductors, and more particularly, to a resonant high conductivity structure made from semiconductor materials.

Superconductivity results in a crystal lattice when electrons which are normally in energy levels within plus or minus $k_bT$ of a fermi energy ($E_F$) collapse into an energy state which is approximately $k_bT_c$ below $E_F$, where $T_c$ is the critical temperature at which superconductivity occurs and $k_b$ is a vector defining a boundary of a brillouin zone for the crystal lattice. Electrons can only collapse by coupling or pairing into what is known as "Cooper pairs". Cooper pairs require each electron in an energy level to have equal momentum and spin which results in a tighter electron packing density than is possible under normal conditions. Paired electrons scatter with equal and opposite change in momentum, and thus no net loss in electron energy. Thus paired electrons carry charge in their energy level with zero resistance.

Accordingly, a key feature of superconducting materials is an ability to allow electrons to exist as paired electrons rather than fermions, which are responsible for normal resistive charge conduction. Much work has been done recently to develop materials in which paired electrons can exist at high temperatures. The present invention deals with a method of promoting the formation of paired electrons at temperatures where such pairing would not naturally occur.

Electrons in a crystal lattice have a characteristic coherence length which is determined by electronic and crystallographic properties of the crystal lattice. External forces such as heat and electromagnetic fields affect this electron coherence length. Electrons in normal conduction states repel each other, and will not come close enough to form pairs. Electrons in superconductors, it is believed, interact with lattice vibrations (phonons) to form pairs. Paired electrons are closer to each other than the electron coherence length. In naturally occurring superconductors electron-phonon interactions result in superconductivity at low temperature, where the electron coherence length is sufficiently long.

The present invention uses semiconductor materials to provide a synthetic lattice which is adapted to promote electron-phonon interaction, and in particular, to promote electron-phonon interactions which result in formation of paired electrons in materials and at temperatures where paired electrons do not normally exist.

A similar enhanced conductivity material is disclosed in co-pending application 07/411,780 by the same inventor as the present invention and assigned to the same assignee. This previous application is incorporated herein by reference.

Accordingly, an object of the present invention is to provide a new highly conductive material having a higher number of electron-phonon interactions.

Another object of the present invention is to provide an enhanced conductivity material having a resonant electron-phonon interaction process.

A further object of the present invention is to provide an enhanced conductivity material using a modulation doped superlattice quantum well.

Yet a further object of the present invention is to provide a resonant superlattice with quantum wells having phonon generators with an optical longitudinal phonon energy equal to spacing between two energy states.

SUMMARY OF THE INVENTION

The above and other objects and advantages of the present invention are achieved by an enhanced conductivity quantum well structure. The quantum well structure provides electrons confined in a narrow energy gap material which is sandwiched between two barrier layers made of larger bandgap material. The electrons are provided to the quantum well by doping material in the barrier layers to provide modulation doping of the quantum well. The quantum well contains at least one monolayer of another material within its boundaries. The monolayer material is preferably electrically inactive and is a source of phonons which are generated for the purpose of electron-phonon coupling in order to cause electron pairing. In a preferred embodiment a plurality of phonon generator monolayers will be provided in the center of a quantum well, wherein the phonon generator monolayers are separated from each other by a few monolayers of quantum well material to provide increased number of phonons and therefore increased number of electron-phonon interactions.

BRIEF DESCRIPTION OF THE DRAWINGS

FIG. 1 illustrates an enlarged view of a small portion of the present invention; and FIG. 2 illustrates a conduction band diagram of quantum well characteristics of the present invention.

DETAILED DESCRIPTION OF THE DRAWINGS

The present invention enhances conductivity of superlattice layers by promoting electron coupling in a superlattice structure. Coupled electrons are believed to carry charge in normally resistive or insulating materials with zero energy loss due to scattering of the electrons. Paired electrons can be formed by electron interactions with a crystal lattice, also known as electron-phonon interactions. In most naturally occurring superconductive materials, characteristic energy levels and phonon spectra are such that electron pairing and thus superconductivity can occur. The present invention involves creating a synthetic material in which energy levels of a quantum well are designed to match with optical phonon energies of a phonon generator which is placed in the quantum well. Further, the present invention involves specific relationships between energy levels and phonon generator energy which result in a resonant condition in a quantum well which maximizes the probability of electron-phonon interaction, and therefore maximizes the formation of paired electrons.

FIG. 1 illustrates a highly enlarged view of a small portion of the present invention. Barrier layers 13a-b and 14a-b comprise a wide bandgap material such as aluminum gallium arsenide (AlGaAs), or the like. A quantum well is formed between barrier layers 13a-14a by narrow bandgap layers 11, 12, and 16. Gallium arsenide (GaAs) is a suitable material for the quantum well layers when AlGaAs is used for barrier layers 13a-14a. As should be apparent, a wide variety of materials including silicon, germanium as well as III-V and II-VI compound semiconductors may be used to form barrier layers 13a-14a and the quantum well layers 11, 12, and 16. It is important, however, that barrier layers 13a–14a have a wider band gap than quantum well layers 11, 12, and 16. As will become apparent, the particular choice of materials will be determined by desired relationships between quantum energy levels and phonon energy spectra of the materials.

Towards the center of the quantum well a number of phonon generator layers 10 are formed separated from each other by layers 16 of quantum well material. Preferably, each phonon generator layer 10 comprises a monolayer of a material which has an optical phonon energy less than that of the quantum well material. Indium arsenide (InAs) is a good choice for phonon generators 10 when GaAs is used for quantum well layers 11, 12, and 16 because InAs has an optical phonon energy less than that of GaAs. Intermediate quantum well layers 16 preferably comprise five to ten monolayers of quantum well material.

Doping layers 21 and 22 which are formed in barrier layers 13a–14a provide charge carriers which then fall into the quantum well. To provide electrons to the quantum well, layers 21 and 22 may comprise any suitable material such as silicon, or the like. Doping layers 21 and 22 must be placed close enough to the quantum well so that electrons can tunnel through barrier layers 14a and 13a to reach quantum well layers 11 and 12.

In operation current flows through the superlattice structure shown in FIG. 1 parallel to the plane of the layers. Also, current flows primarily in quantum well layers 11, 12, and 16 as opposed to barrier layers 13 and 14. Although the invention has been described in terms of specific material types for each layer, it should be understood that it is the relationship between band gap energy and phonon spectra of each of the layers that is important. It will be apparent to those of skill in the art that numerous combinations of materials can be used to produce quantum wells, barrier layers, and modulation doping. As will be seen, phonon generator layers 10 may also comprise different materials, particularly when different quantum well materials are chosen. Also, although the present invention is described in terms of electron coupling to form Cooper pairs, it should be understood that hole coupling will also result in enhanced conductivity The principles and elements of the present invention are equally applicable to hole coupling when material and doping changes are made.

FIG. 2 illustrates a conduction band, $E_c$, diagram of the quantum well shown in FIG. 1. The conduction band diagram shown in FIG. 2 is a highly simplified view of a superlattice structure having phonon generators 10 shown in FIG. 1. Phonon generators 10 correspond to spike 20 in the conduction band shown in FIG. 2. Although a single spike 20 is shown for ease of illustration, it should be understood that a spike 20 exists for each monolayer 10 which is formed in the quantum well. Each monolayer 10 results in a spike 20 near the center of quantum well 18. Since each monolayer 10 is only one atom wide and separated from each other by only a few atoms of quantum well material, many layers can be formed within a few angstroms of the center of quantum well 18. Conduction energy levels 19 and 17 correspond to barrier layers 14a and 13a. Quantum well 18 comprises layers 11 and 12 shown in FIG. 1. Quantum well 18 has a narrower bandgap than barrier layers 14a and 13a and thus a drop in the conduction band energy exists in quantum well 18.

Electrons moving in a direction parallel to the layers which make up quantum well 18 has characteristic energy levels $E_1$ and $E_2$. Electrons travelling in quantum well 18 can travel only at discrete energy values described by electron wave functions $E_1$ and $E_2$. It should be noted that electrons must have relatively low energy in the direction of motion to prevent excitation to higher energy levels. Such excitation inhibits electron coupling and thus superconductivity. A charge distribution of phonon generator 20 will have a maxima which is in the center of quantum well 18. The electron wave function in the ground state, $E_1$, also has a maxima in the center of quantum well 18. An electron in the ground state can couple strongly to the phonon generator phonon and become excited to the next state upon absorption of the phonon. The state $E_2$, is characterized by an asymmetric wave function that passes through zero at the center of quantum well 18. Electrons in this state will couple weakly to the phonon generator and will tend to not absorb a phonon generator phonon. Instead, electrons in the $E_2$ state are more likely to emit a phonon generator phonon. In this structure, electrons in the first excited state absorb phonons while electrons in the second excited state emit phonons.

An important feature of the present invention is that phonons produced by the phonon generator have substantially the same energy as the difference between $E_2$ and $E_1$. Because the energy gap between first and second energy states of quantum well 18 ($E_1 - E_2$) is substantially equal to the phonon energy of the phonon generator, the electron-phonon interactions caused by the presence of the phonon generator causes electrons to be paired by the absorption-emission process. The coupling between electrons and phonons can be expressed by the equation:

$$M = \frac{1}{((E_2 - E_1) - \hbar\omega_{LO}^{PG})}$$

where M is proportional to electron-phonon coupling and $\hbar\omega_{LO}^{PG}$ is the energy of a longitudinal optical (LO) phonon generator (PG) phonon.

In the present invention, the spacing between the first two energy levels ($E_1 - E_2$) is equal to one optical phonon energy ($\hbar\omega_{LO}^{PG}$). From the electron-phonon coupling equation it can be seen that this relationship between phonon energy and energy levels $E_1$ and $E_2$ results in a resonance condition which maximizes electron-phonon interaction. It is convenient to build the entire structure from commonly available epitaxial materials such as GaAs, AlGaAs, and InAs. Since GaAs has an longitudinal optical phonon energy of about 37 meV, InAs which has an optical phonon energy of about 30.5 meV is a good phonon generator choice. The required spacing between the first two energy levels ($E_1 - E_2$) is about 30.5 meV when InAs is used as a phonon generator. The parameters of a rectangular quantum well that produce this energy level spacing are:
Well material = GaAs
Barrier material = AlGaAs
Barrier layer potential, $V_o$ = 0.122 eV
Quantum well length, $L_w$ = 64 monolayers of GaAs = 181.12 angstroms.
This $V_o$ corresponds to a barrier material comprising $Al_{0.15}Ga_{0.85}As$.

In a well as wide as this, it may desirable to have more than one phonon generator. It is believed that three to seven phonon generator layers will increase electron-phonon interaction and therefore increase the probability of the formation of electron pairs. In a preferred embodiment, five monolayers of phonon generator material are spaced apart by five to ten monolayers of quantum well material around the center of the quantum well, as illustrated in FIG. 1.

In order to effectively create electron pairs a sufficient number of electrons must be provided to the quantum well. In a preferred embodiment, electrons are provided to the quantum well by modulation doping. Modulation doping is a technique for doping barrier layer 13-14 (shown in FIG. 1) to provide charge carriers to quantum well layer in a superlattice. Other techniques are known for providing excess electrons in a quantum well. If fewer electrons are available in the quantum well to form electron pairs, it will be necessary for the electron coherence length to be longer to compensate for the fewer number of electrons. Thus, as the electron density increases the critical temperature for enhanced conductivity will also increase. Using a number of phonon generators rather than a single phonon generator also compensates for low concentration of electrons in the quantum well layers.

By now it should be appreciated that there has been provided a novel synthetic or artificial enhanced conductivity material capable of operating at temperatures well above known superconductivity temperatures of the materials used. The invention employs a superlattice structure having a plurality of phonon generators sandwiched between two quantum well layers wherein the phonon generator generates phonons having optical energy substantially equal to the difference between energy levels of the quantum well. The interaction between electrons in the quantum well and phonons generated by the phonon generator causes a resonant condition in which electrons interact with the quantum well lattice absorbing and emitting phonons which in turn couple the electrons. The coupled electrons can travel through the crystal lattice parallel to the phonon generator layer in a highly conducive state.

I claim:
1. A resonant superlattice conductor comprising:
   a barrier layer;
   a first layer of material positioned on the barrier layer and having a first and second energy level;
   at least one monoatomic layer positioned over the first layer having optical phonons at an energy level substantially equal to the difference between the first and second energy levels of the first layer of material; and
   a second layer of material positioned on the monoatomic layers having the same energy levels as the first layer of material.

2. The conductor of claim 1 wherein the barrier layer comprises AlGaAs, the first and second layers comprise GaAs, and the monoatomic layer comprises InAs.

3. The conductor of claim 1 wherein the barrier layer serves to confine electrons to a quantum well formed by the first and second layers in the monoatomic layer.

4. The conductor of claim 3 wherein the barrier layer is doped and serves to provide electrons to the quantum well.

5. A conductor having a plurality of quantum wells, each quantum well being separated by a barrier layer, and each quantum well comprising a material having first and second energy levels; and
   a monoatomic layer located towards the center of each of the quantum wells and having phonons with an optical energy level equal to the difference between the first and second energy levels of the quantum well.

6. The conductor of claim 5 wherein the monoatomic layer comprises InAs.

7. The conductor of claim 5 wherein the semiconducting material comprises a III-IV compound material.

8. A syntheticly enhanced conductor having a superlattice structure comprising:
   a phonon generator which produces optical phonons of energy $\hbar\omega_{lo}^{pg}$; and
   a quantum well having at least two layers, wherein the phonon generator is sandwiched between the two layers of the quantum well and the quantum well has energy levels at $E_1$ and $E_2$, wherein $E_2 - E_1$ is substantially equal to $\hbar\omega_{lo}^{pg}$.

9. The syntheticly enhanced conductor of claim 8 further including a barrier layer to prevent electrons from escaping the quantum well.

10. The syntheticly enhanced conductor of claim 9 wherein the barrier layer provides electrons to the quantum well.

* * * * *